(12) United States Patent
Jung

(10) Patent No.: US 7,208,371 B2
(45) Date of Patent: Apr. 24, 2007

(54) METHOD OF FABRICATING SPLIT GATE FLASH MEMORY DEVICE

(75) Inventor: Jin Hyo Jung, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 12 days.

(21) Appl. No.: 11/024,745

(22) Filed: Dec. 30, 2004

(65) Prior Publication Data

US 2005/0142758 A1    Jun. 30, 2005

(30) Foreign Application Priority Data

Dec. 31, 2003    (KR) .................. 10-2003-0101393

(51) Int. Cl.
*H01L 21/336* (2006.01)

(52) U.S. Cl. ............... 438/257; 438/258; 257/E21.68; 257/E21.645; 257/E29.129

(58) Field of Classification Search ............... 438/257, 438/258, 211, 263, 264, 266, 267, 278, 289, 438/594, 595, 704, 712, 733
See application file for complete search history.

(56) References Cited

U.S. PATENT DOCUMENTS

| | | | | |
|---|---|---|---|---|
| 5,811,853 A | * | 9/1998 | Wang | ............... 257/316 |
| 5,950,087 A | * | 9/1999 | Hsieh et al. | ............... 438/264 |
| 6,027,971 A | * | 2/2000 | Cho et al. | ............... 438/257 |
| 6,046,086 A | * | 4/2000 | Lin et al. | ............... 438/264 |
| 6,114,723 A | * | 9/2000 | Leu | ............... 257/316 |
| 6,121,087 A | | 9/2000 | Mann et al. | ............... 438/528 |
| 6,174,771 B1 | * | 1/2001 | Leu | ............... 438/257 |
| 2003/0064564 A1 | | 4/2003 | Lin | |

* cited by examiner

*Primary Examiner*—David Nhu
(74) *Attorney, Agent, or Firm*—Lowe Hauptman & Berner, LLP

(57) ABSTRACT

A method of fabricating a split gate flash memory device by which stringer generation is prevented. The method includes forming a dielectric layer on an active area of a semiconductor substrate, forming a first gate covered with a cap layer on the dielectric layer, and forming an insulating layer on a sidewall of the first gate. The method also includes forming a dummy spacer over the sidewall of the first gate, the first gate including the cap layer and the insulating layer, and removing the dielectric layer failing to be covered with the dummy spacer and the dummy spacer to form an exposed portion of the substrate. The method further includes forming a gate insulating layer on the exposed portion of the substrate, and forming a second gate overlapping one side of the first gate, wherein a split gate is configured with the first and second gates.

5 Claims, 6 Drawing Sheets

METHOD OF FABRICATING SPLIT GATE FLASH MEMORY DEVICE

BACKGROUND OF THE INVENTION

1. Field of the Invention

The present invention relates to a method of fabricating a split gate flash memory device.

2. Discussion of the Related Art

Generally, a flash memory device, which is a non-volatile memory device capable of maintaining information stored in its memory cell without a power supply, is mounted on a circuit board to enable high-speed electrical erasures. Flash memory technology keeps evolving in a manner of modifying cell structures variously. The various cells can be classified into a stacked gate cell, a split gate cell, and the like.

In the stacked gate cell, a floating gate and a control gate are sequentially stacked. Yet, the stacked gate cell has a problem of over-erasing. The over-erasing takes place when the floating gate is over-discharged. A threshold voltage of the over-discharged cell shows a negative value. Even if the cell is not selected, i.e., even if a read voltage is not applied to the control gate, a current flow takes place. To overcome the over-erase problem, a split gate cell structure has been proposed.

A method of fabricating a split gate flash memory device according to a related art is explained as follows.

FIGS. 1A to 1D are cross-sectional diagrams for explaining a method of fabricating a split gate flash memory device according to a related art.

Referring to FIG. 1A, an ONO (oxide-nitride-oxide) layer 102, a first conductor layer, an oxide layer 104, and a nitride layer 105 are sequentially stacked on a semiconductor substrate 101. The nitride layer 105, the oxide layer 104, and the conductor layer are patterned to form a first gate pattern 103. Annealing is carried out on the substrate 101 to grow thermal oxide layers 106 on left and right sidewalls of the first gate pattern 103.

Referring to FIG. 1B, an exposed portion of the ONO layer 102 not covered with the first gate pattern 103 is etched away. A gate oxide layer 107 is grown on an exposed surface of the substrate by thermal oxidation. A second conductor layer 108 is then deposited over the substrate including the first gate pattern 103.

Referring to FIG. 1C, the second conductor layer 108 is selectively patterned to remain on one side of the first gate pattern 103. Hence, a second gate pattern 108a is formed on one side of the first gate pattern 103 to complete a split gate constructed with the first and second gate patterns 103 and 108a. A thermal oxide layer 109 is formed on a surface of the second gate pattern 108a. Ion implantation is lightly carried out on the substrate 101 to form lightly doped regions n− for an LDD (lightly doped drain) structure in the substrate below both sides of the split gate, respectively.

Referring to FIG. 1D, a spacer 110 is formed on a sidewall of the second gate pattern 108a. Ion implantation is heavily carried out on the substrate to form heavily doped regions n+ for a source and drain in the substrate adjacent to the lightly doped regions, respectively. A pair of symmetrical split gates is formed in a memory cell area by the related art method. Since the first gate pattern, the oxide layer and the nitride layer are stacked on a pair of prescribed portions of the substrate in depositing the second conductor layer for the second gate patterns of the split gates, a recess is provided between a pair of split gate areas due to the step difference of the first gate pattern, oxide layer and nitride layer.

In forming the second gate patterns by patterning the second conductor layer, a portion of the second conductor layer between a pair of the split gate areas is incompletely etched whereas the other portion of the split gate areas is completely removed.

Specifically, a polymer is generated as an etch residue 108b when the second conductor layer is selectively removed by wet etch. The polymer is accumulated between the first gate patterns and prevents an etchant gas from being sufficiently supplied to the space between a pair of the split gates. This prevents completion of the etching process.

As a result, stringers 120 in FIG. 3 are generated in the space between a pair of the split gate areas. The space between a pair of the split gate areas corresponds to a portion where a contact hole for connection to an upper line will be formed. Hence, the stringers degrade electrical characteristics such as contact resistance and the like.

In the related art method, the thickness of the insulating layer stacked on the first gate pattern is decreased to suppress the generation of the stringers. However, if the thickness of the insulating layer stacked on the first gate pattern is decreased, parasitic capacitance between the first and second gate patterns is increased.

SUMMARY OF THE INVENTION

Accordingly, the present invention is directed to a method of fabricating a split gate flash memory device that substantially obviates one or more problems due to limitations and disadvantages of the related art.

The present invention advantageously provides a method of fabricating a split gate flash memory device by which stringers are prevented from remaining between a pair of split gates.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of fabricating a split gate flash memory device according to the present invention includes the steps of forming a dielectric layer on an active area of a semiconductor substrate, forming a first gate covered with a cap layer on the dielectric layer, forming an insulating layer on a sidewall of the first gate, forming a dummy spacer over the sidewall of the first gate, the first gate including the cap layer and the insulating layer, removing the dielectric layer not covered with the dummy spacer and the dummy spacer to expose a portion of the substrate, forming a gate insulating layer on the exposed portion of the substrate, and forming a second gate overlapping one side of the first gate, wherein a split gate is configured with the first and second gates.

In an exemplary embodiment, the method further includes the step of forming a pair of doped regions in active area of the substrate to be aligned with the dummy spacer and the second gate, respectively.

In an exemplary embodiment, the cap layer includes an oxide layer and a nitride layer.

In an exemplary embodiment, the second gate is formed by carrying out anisotropic etch on a conductor layer deposited over the substrate, the conductor layer including the dummy spacer and the cap layer.

In an exemplary embodiment, the step of forming doped regions includes the steps of forming lightly doped regions in the substrate aligned with the dummy spacer and the second gate, respectively, forming a spacer on a sidewall of the split gate, and forming heavily doped regions in the substrate to be aligned with the spacer, respectively.

It is to be understood that both the foregoing general description and the following detailed description of the present invention are exemplary, but are not restrictive of the invention.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to exemplary embodiments of the present invention, which are illustrated in the accompanying drawings. Wherever possible, the same reference numbers will be used throughout the drawings to refer to the same or like parts.

FIGS. 2A to 2E are cross-sectional diagrams for explaining a method of fabricating a split gate flash memory device according to the present invention.

Figure 1A:
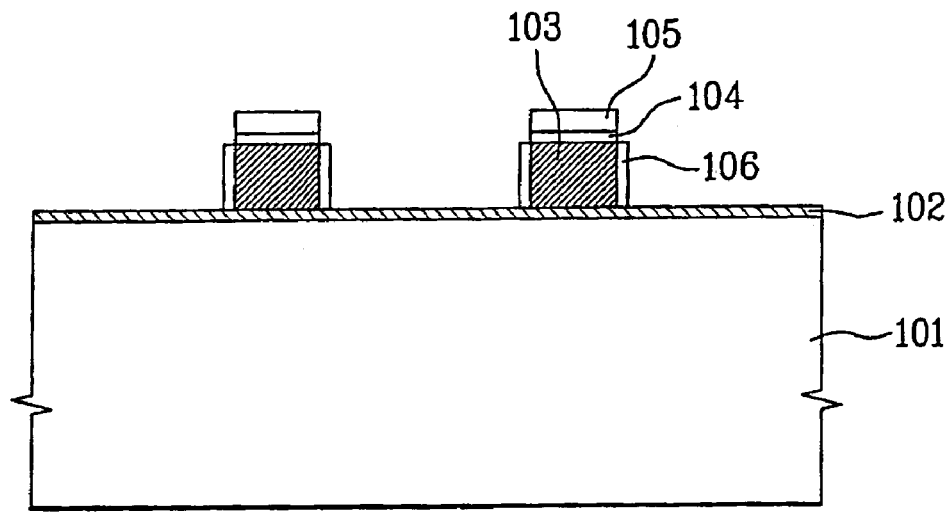
FIGS. 1A to 1D are cross-sectional diagrams for explaining a method of fabricating a split gate flash memory device according to a related art.
Figure 1B:
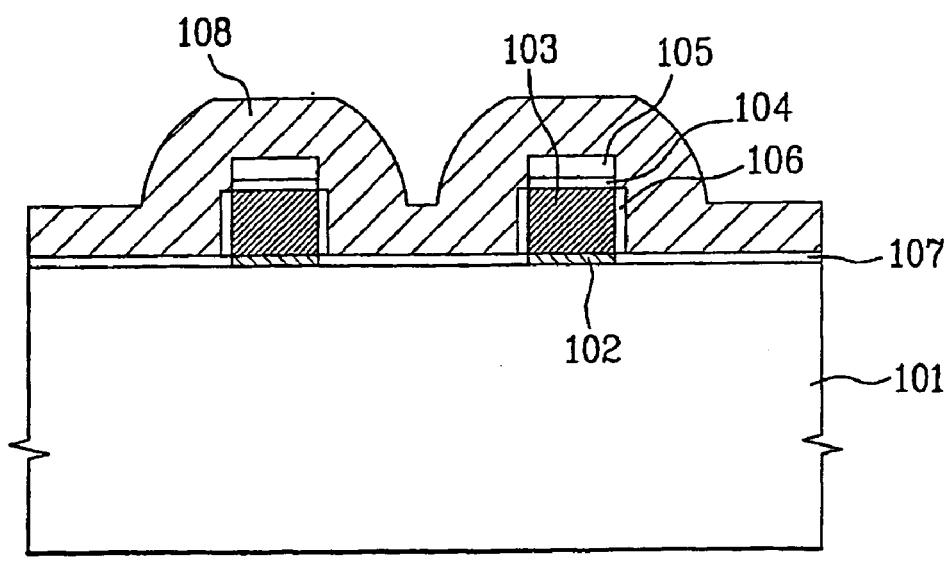
Figure 1C:
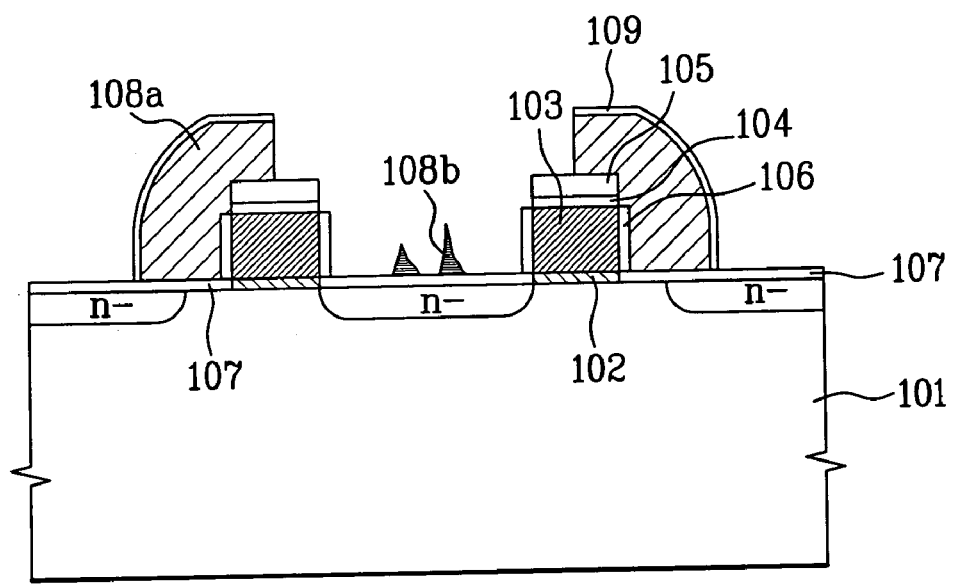
Figure 1D:
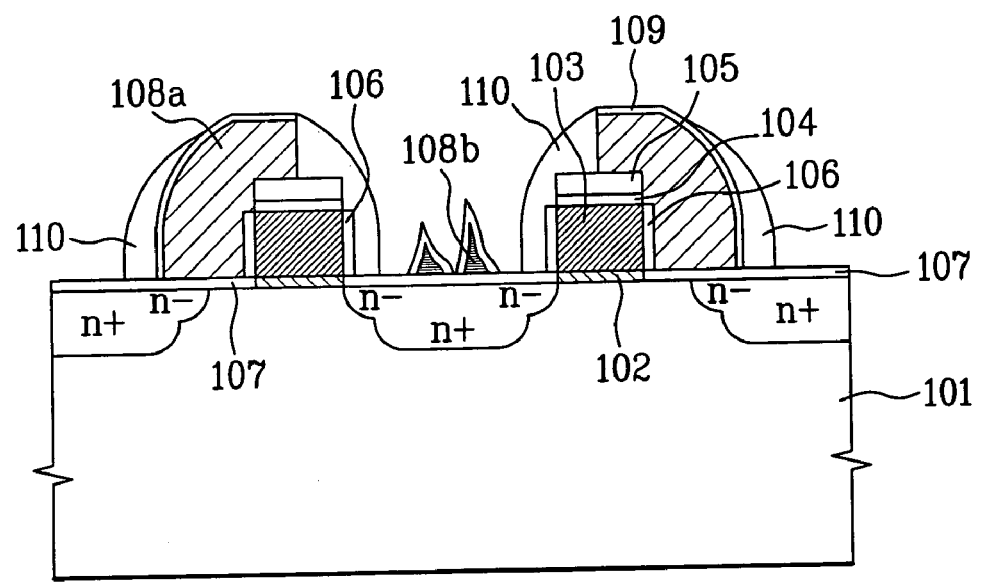
Figure 2A:
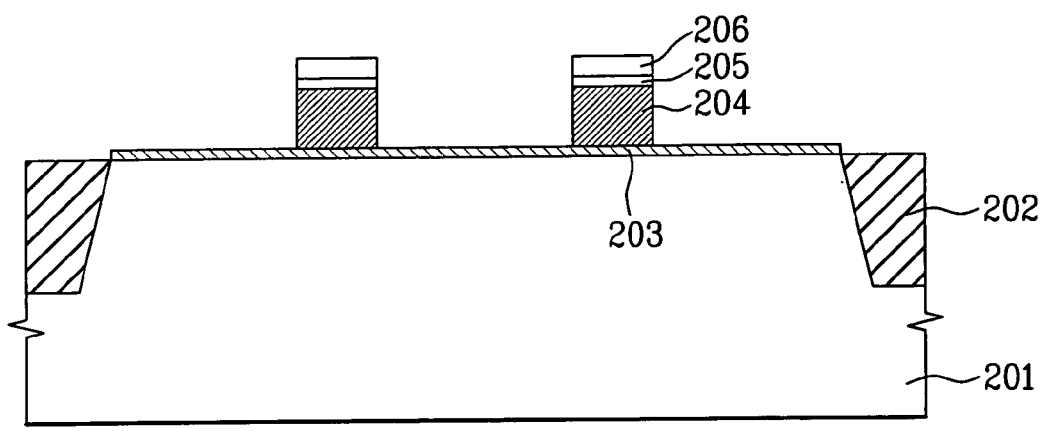
FIGS. 2A to 2E are cross-sectional diagrams for explaining a method of fabricating a split gate flash memory device according to the present invention.

Referring to FIG. 2A, a device isolation layer 202 is formed on a semiconductor substrate 201 formed of single crystalline silicon or the like. The device isolation layer 202 is formed by an isolation process such as STI (shallow trench isolation) to define an active area on the substrate 201. A dielectric layer 203 is formed on the substrate 201. The dielectric layer 203 may have an oxide-nitride-oxide structure.

A first conductor layer and an insulating layer are sequentially stacked on the dielectric layer 203. The first conductor layer may be formed of polysilicon. The insulating layer as a cap layer may include a double layer consisting of an oxide layer 205 and a nitride layer 206.

After a photoresist layer has been coated on the insulating layer, exposure and development are carried out on the photoresist layer to form a photoresist pattern (not shown in the drawing) defining a first gate pattern area. The insulating layer and the first conductor layer are sequentially etched using the photoresist pattern as an etch mask to form a first gate pattern 204 covered with an insulating layer pattern. A neighboring first gate pattern having a same structure of the first gate pattern 204 is simultaneously formed on the same active area of the dielectric layer 203 a prescribed distance away. The photoresist pattern is then removed.

Figure 2B:
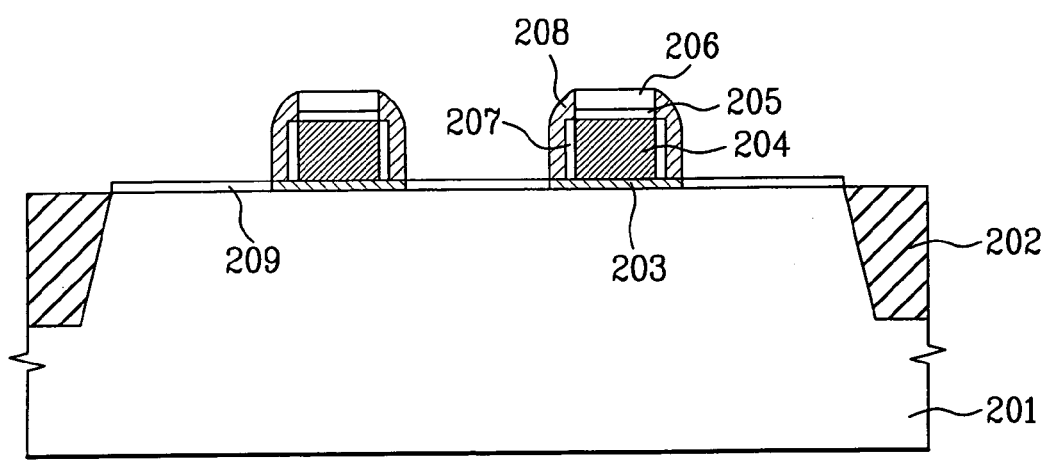

Referring to FIG. 2B, thermal oxidation is carried out on the substrate to grow a thermal oxide layer 207 on sidewalls of the first gate pattern 204 and the neighboring gate pattern. The insulating layer pattern on the first gate pattern 204 and the thermal oxide layer on the sidewall of the first gate pattern 204 will be inserted between the first gate pattern 204 and a second gate pattern 210a that will be formed to play a role in reducing parasitic capacitance between the first and second gate patterns. Simultaneously, the same structure is provided to the neighboring first gate pattern.

An oxide layer is deposited over the substrate 201 including the insulating layer pattern 206. The oxide layer is anisotropically etched by a dry etch process such as RIE (reactive ion etch) until the insulating layer pattern and the dielectric layer 203 are exposed. Hence, a dummy spacer 208 is formed on the sidewalls of the first gate pattern including the insulating layer pattern. Simultaneously, the same dummy spacer is formed on the sidewalls of the neighboring first gate pattern.

The dielectric layer 203 not covered with the first gate pattern, the neighboring first gate pattern, and the dummy spacers 208 are etched away. Hence, a dielectric layer pattern 203 only remains beneath the first gate pattern, the neighboring first gate pattern, and the dummy spacers 208. A surface of the substrate not covered with the dielectric layer pattern 203 in the active area is exposed. A gate oxide layer 209 is formed on the exposed surface of the substrate 201 in the active area by thermal oxidation.

Figure 2C:
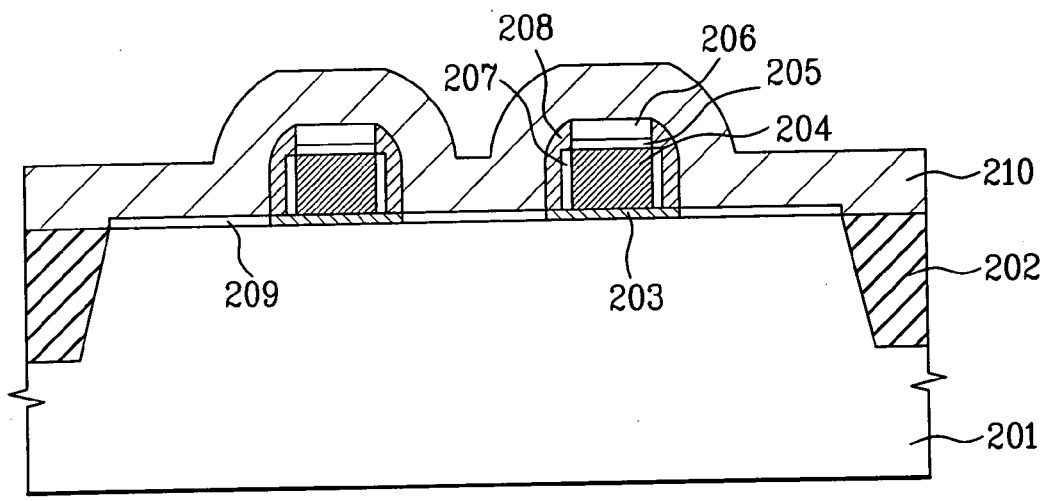
Figure 2D:
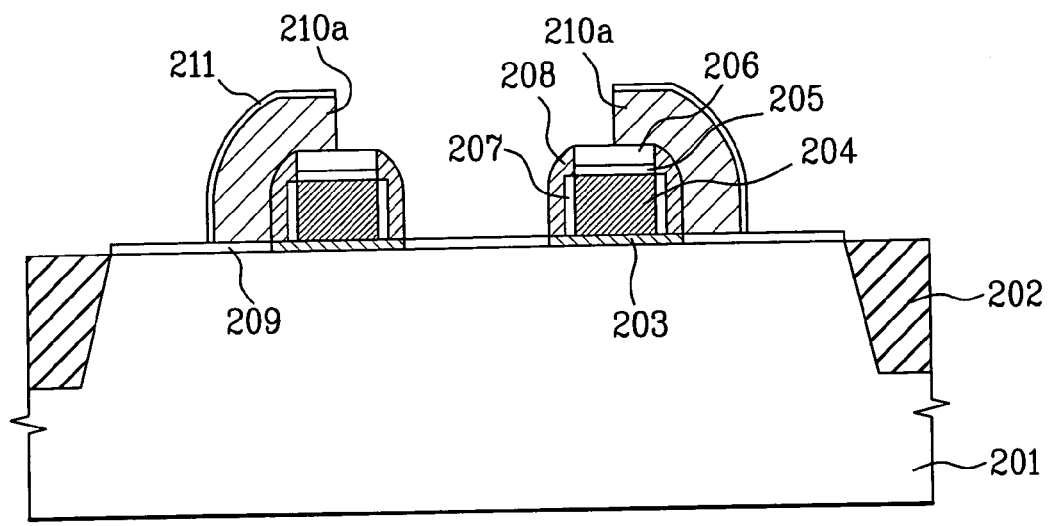

Referring to FIG. 2C, a second conductor layer 210 for a second gate pattern and a neighboring second gate pattern is deposited over the substrate 201 including the first gate pattern 204 and the neighboring first gate pattern. The second conductor layer 210 deposited in the space between the pair of the split gate areas, i.e., between the first gate pattern 204 and the neighboring gate pattern, has a gentle slope attributed to the dummy spacers 208, despite the step difference between the split gate area and the substrate 201. Referring to FIG. 2D, the second conductor layer 210 is selectively patterned to remain on the second gate pattern area and a neighboring second gate pattern area to form a second gate pattern 210a and a neighboring second gate pattern 210a having a symmetric structure to that of the second gate pattern 210a, respectively. Since the second conductor layer 210 deposited between the first gate pattern 204 and the neighboring gate pattern has the gentle slope, an etchant gas is sufficiently provided to the space between the pair of the split gate areas in etching the second conductor layer 210 to suppress stringer generation in this area.

A thermal oxide layer 211 is formed on a surface of the second gate pattern 210a by thermal oxidation. Hence, a split gate including the first and second gate patterns 204 and 210a is completed. The other split gate, including the neighboring first and second gate patterns having a symmetric structure to that of the former split gate, is simultaneously provided to the other split gate area.

Figure 2E:
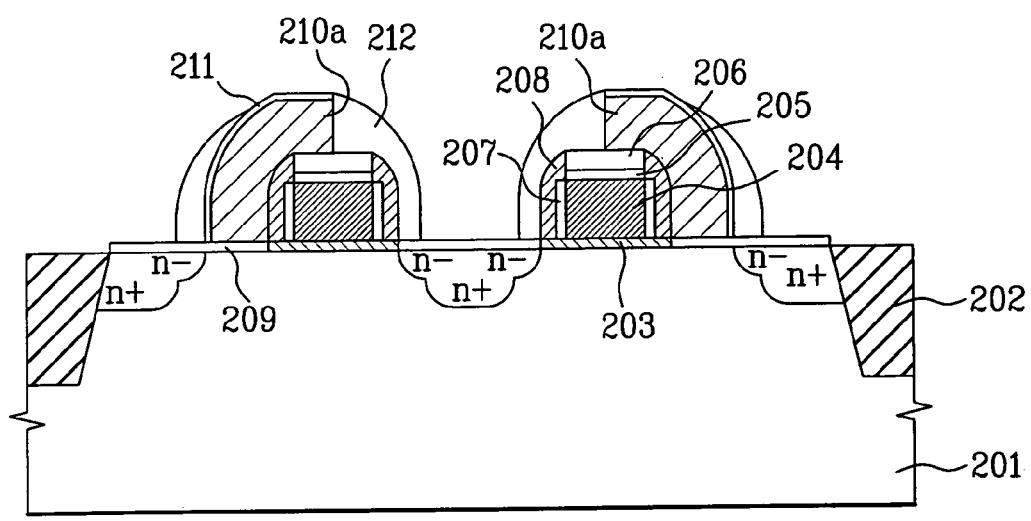
Figure 3:
FIG. 3 is a scanning electron microscope (SEM) picture of a split gate flash memory device according to a related art, in which stringers are shown.

Referring to FIG. 2E, LDD ion implantation is carried out on the substrate 201 to form lightly doped regions n– for LDD structures aligned with the dummy spacer 208 and the second gate pattern 201a of each of the split gates, respectively. An oxide layer and a nitride layer are sequentially stacked over the substrate 201 including the split gates and anisotropically etched to form spacers 212 on sidewalls of the split gates, respectively. Heavy ion implantation is carried out on the substrate 201 to form heavily doped regions n+ for sources and drains of the split gates.

Thereafter, an insulating interlayer (not shown in the drawing) is deposited over the substrate 201 including the split gates. The insulating layer is selectively etched to form a contact hole exposing the space between the pair of the split gates. Since the stringers are not generated in the space between the pair of the split gates, contact resistance is not degraded.

Accordingly, in the present invention, a dummy spacer having a prescribed thickness is provided on the sidewall of the first gate pattern prior to forming the second gate pattern to lower the step difference between the second conductor layer and the substrate, whereby stringers are prevented from occurring in the space between a pair of the split gate areas.

Therefore, the present invention prevents the stringers from remaining in the space between a pair of the split gate areas, thereby enhancing electrical characteristics of the memory device.

Korean Patent Application No. P2003-0101393, filed on Dec. 31, 2003, is hereby incorporated by reference in its entirety.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a split gate flash memory device, comprising the steps of:
   forming a dielectric layer on an active area of a semiconductor substrate;
   forming a first gate covered with a cap layer on the dielectric layer;
   forming an insulating layer on a sidewall of the first gate;
   forming dummy spacers over the sidewall of the first gate, the first gate including the cap layer and the insulating layer;
   removing the dielectric layer not covered with the dummy spacers and the first gate to form an exposed portion of the semiconductor substrate;
   forming a gate insulating layer on the exposed portion of the semiconductor substrate; and
   forming a second gate overlapping one side of the first gate, wherein a split gate is configured with the first and second gates,
   wherein a dielectric layer pattern remains beneath the dummy spacers and the first gate as a result of the step of removing the dielectric layer not covered with the dummy spacers and the first gate.

2. The method of claim 1, further comprising the step of forming a pair of doped regions in the active area of the semiconductor substrate, the pair of doped regions aligned with the dummy spacer and the second gate, respectively.

3. The method of claim 1, wherein the cap layer comprises an oxide layer and a nitride layer.

4. The method of claim 1, wherein the step of forming a second gate includes carrying out anisotropic etch on a conductor layer deposited over the semiconductor substrate including the dummy spacer and the cap layer.

5. The method of claim 2, wherein the step of forming a pair of doped regions includes the steps of:
   forming lightly doped regions in the semiconductor substrate aligned with the dummy spacer and the second gate, respectively;
   forming a spacer on a sidewall of the split gate; and
   forming heavily doped regions in the substrate aligned with the spacer, respectively.

* * * * *